United States Patent
Hashimoto et al.

(10) Patent No.: US 6,797,744 B2
(45) Date of Patent: Sep. 28, 2004

(54) RADIO WAVE ABSORBER COMPOSITION

(75) Inventors: Osamu Hashimoto, Sagamihara (JP); Tetsu Soh, Hiratsuka (JP); Masato Tadokoro, Hiratsuka (JP)

(73) Assignee: The Yokohama Rubber Co., Ltd., Tokyo (JP)

( * ) Notice: Subject to any disclaimer, the term of this patent is extended or adjusted under 35 U.S.C. 154(b) by 191 days.

(21) Appl. No.: 10/048,064

(22) PCT Filed: Jun. 1, 2001

(86) PCT No.: PCT/JP01/04645
§ 371 (c)(1),
(2), (4) Date: Jan. 28, 2002

(87) PCT Pub. No.: WO01/93651
PCT Pub. Date: Dec. 6, 2001

(65) Prior Publication Data
US 2002/0179889 A1 Dec. 5, 2002

(30) Foreign Application Priority Data

Jun. 1, 2000 (JP) .................................... 2000-164931
Jan. 30, 2001 (JP) .................................... 2001-21070

(51) Int. Cl.[7] .............................................. G21K 1/10
(52) U.S. Cl. ..................... 523/137; 252/478; 428/319.1
(58) Field of Search ..................... 523/137; 428/425.9, 428/319.1; 252/478

(56) References Cited

U.S. PATENT DOCUMENTS

| 4,460,730 A | * | 7/1984 | Koyama et al. ............. 524/403 |
| 5,777,586 A | * | 7/1998 | Luxon et al. ................ 343/702 |
| 6,146,545 A | * | 11/2000 | Murase .................... 252/62.56 |
| 6,280,842 B1 | * | 8/2001 | Nishibori et al. ........... 428/402 |
| 6,335,479 B1 | * | 1/2002 | Yamada et al. ............. 136/251 |
| 6,479,140 B1 | * | 11/2002 | Takao et al. ............. 428/317.9 |

FOREIGN PATENT DOCUMENTS

| JP | 53-92854 | | 8/1978 |
| JP | 02-170860 | | 7/1990 |
| JP | 406275982 A | * | 9/1994 |
| JP | 409232787 A | * | 9/1997 |
| JP | 2000-151179 | | 5/2000 |
| WO | WO 9925166 A1 | * | 5/1999 ............. H05K/9/00 |

* cited by examiner

*Primary Examiner*—Cephia D. Toomer
(74) *Attorney, Agent, or Firm*—Rader, Fishman & Grauer PLLC

(57) ABSTRACT

There is disclosed a composition which is layered in a reflective board to constitute a radio wave absorber. In this composition, an electroconductive titanium oxide is compounded with a substrate. With regard to the substrate, there may be used thermoplastic resin, thermosetting resin, rubber or elastomer.

3 Claims, 4 Drawing Sheets

RADIO WAVE ABSORBER COMPOSITION

TECHNICAL FIELD

This invention relates to a radio wave absorber which is widely used for shipping, airplanes, etc. and, more particularly, it relates to a composition of a radio wave absorber of a single layer type which is applied or placed on a reflector made of metal or the like.

BACKGROUND OF THE INVENTION

In recent years, studies for utilization of radio wave of a microwave range and a millimetric wave range have been briskly carried out in various fields and, as a result, radio wave absorbers for prevention of electromagnetic interference have been receiving public attention.

Among them, wavelength of radio wave of a millimetric wave range is particularly as very short as about 1–10 mm and, therefore, in the so-called "absorption of matching type" where radio wave is absorbed by an absorber placed on the surface of a reflector, there has been a requirement that thickness of the radio wave absorber matching such radio wave is to be made 1 mm or less.

Further, there has been a dilemma in the radio wave absorber compositions up to now that the radio wave absorber having a thickness of some extent is necessary when the radio wave absorbing property for a broad range of radio wave is to be achieved while, when thickness of the radio wave absorber is to be made thin, radio wave absorbing property for a broad range is not available.

DISCLOSURE OF THE INVENTION

An object of this invention is to provide a composition of a radio wave absorber which is able to efficiently absorb the radio wave of a broad range in spite of the fact that it is a radio wave absorber having a thin thickness.

A gist of the radio wave absorber composition of this invention is that an electroconductive titanium oxide is compounded with a substrate for achieving the above-mentioned object.

It is preferred that the compounding ratio of the above-mentioned electroconductive titanium oxide to 100 parts by weight of the substrate is 5–40 parts by weight and it is also preferred that an electroconductive carbon black is compounded in an amount of from more than 0 part by weight to not more than 4 parts by weight to 100 parts by weight of the substrate.

The radio wave absorber composition of this invention is constituted as mentioned above and, when it is applied or placed on a reflector made of metal or the like, it is possible that a radio wave absorber corresponding to any frequency of a microwave range and a millimetric wave range is prepared depending upon the changes in its thickness and it is also possible that radio wave of a broad range can be efficiently absorbed in spite of the radio wave absorber having a thin thickness.

BEST MODE FOR CARRYING OUT THE INVENTION

Figure 1:
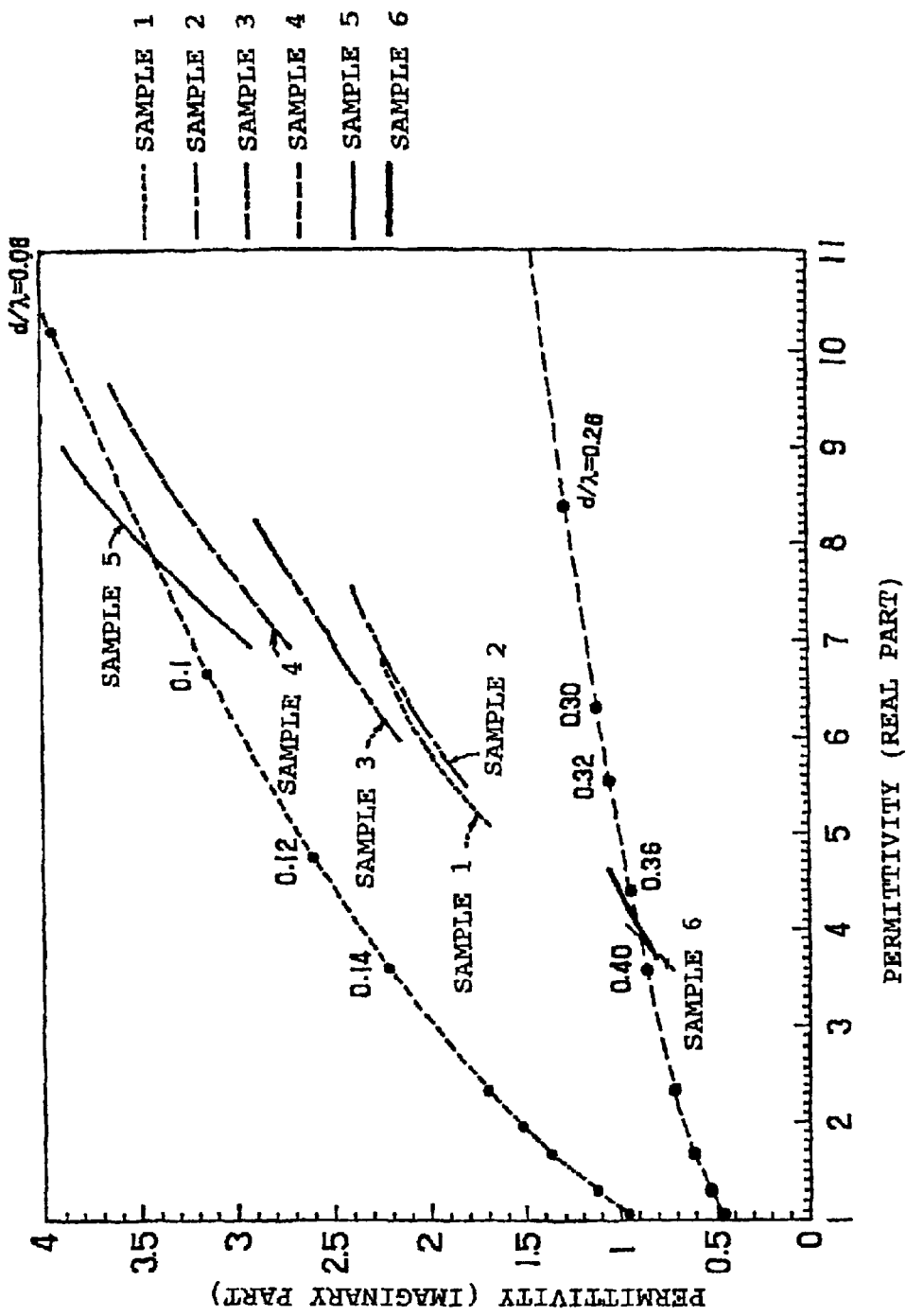
FIG. 1 is a graph showing the result of measurement of complex relative permittivity of a sample of an epoxy resin board in accordance with this invention.

As hereunder, embodiments of this invention will be illustrated in detail by referring to the drawings.

The radio wave absorber composition of this invention is prepared by compounding an electroconductive titanium oxide and, if desired, an electroconductive carbon black with a substrate.

With regard to the substrate, a material which is selected from, for example, thermoplastic resin, thermosetting resin, various kinds of rubbers and elastomer is used. Particularly, a thermosetting resin is able to easily constitute a radio wave absorber having a desired thickness by applying on a reflector followed by setting even when the reflector for a radio wave absorber has projections.

With regard to the above-mentioned thermoplastic resin, it is possible to use, for example, polyolefin resin such as polyethylene and polypropylene; polyamide resin such as Nylon 6 and Nylon 66; polyester resin such as polyethylene terephthalate and polybutylene terephthalate; or a mixture thereof.

With regard to the thermosetting resin, it is appropriately selected from, for example, epoxy resin, polyurethane resin, polyester resin and phenol resin. With regard to a setting agent, that which is commonly used is used and, therefore, there is no particular limitation for its type and quantity.

The above-mentioned electroconductive titanium oxide is that where the surface of titanium oxide comprising spherical crystals of a rutile type or needle crystals of a rutile type is coated with an electroconductive layer such as $SnO_2$/Sb layer. This electroconductive titanium oxide is dispersed in a substrate to make the permittivity of the said substrate high. In addition, the above-mentioned electroconductive titanium oxide has an excellent physical and chemical stability and also has an excellent dispersibility when compounded with a substrate.

With regard to the above-mentioned carbon black, there may be exemplified acetylene black, furnace black and Ketjenblack. Ketjenblack is particularly preferred. The electroconductive carbon black is dispersed in a substrate so as to make the permittivity of the said substrate high.

The compounding amount of the electroconductive titanium oxide and the electroconductive carbon black for achieving the most ideal radio wave absorbing property is determined by frequency of the radio wave and also by complex relative permittivity of the absorber corresponding thereto.

That will be illustrated on the basis of an experiment. Thus, epoxy resin and a setting agent were used as a substrate, then an electroconductive titanium oxide and an electroconductive carbon black in six types of weight ratios to 100 parts by weight of the substrate as shown in Table 1 were added thereto as fillers followed by stirring, the mixture was flown into a-container to prepare a resin board samples (samples 1–6) of 150 mm×150 mm×2 mm (thickness) and their complex relative permittivities at 50–110 GHz (angle of incidence: 0°) were measured by a measuring apparatus for complex relative permittivity in free space manufactured by VHS. In this apparatus, radio wave which transmits the sample is subjected to an impedance measurement by a vector network analyzer whereby a complex relative permittivity is calculated. The result is shown in FIG. 1.

The curve shown by a dotted line in FIG. 1 is a non-reflective curve expressing a complex relative permittivity requested for a material which is to be non-reflective and it shows that, when a material where a complex relative permittivity is present on the non-reflective curve is used, the most ideal radio wave absorber can be obtained.

It is also possible that, on the non-reflective curve, ratio (d/λ) of the wavelength λ (mm) to the sample thickness d (mm) is plotted and the value of d/λ is determined by the complex relative permittivity of the sample. Accordingly, it is possible to determine the thickness of the radio wave absorber depending upon the wavelength of the objective wavelength.

TABLE 1

| Sample | Electroconductive Titanium Oxide | Electroconductive Carbon Black |
| --- | --- | --- |
| 1 | 20 | 0 |
| 2 | 20 | 1 |
| 3 | 20 | 2 |
| 4 | 30 | 1 |
| 5 | 32 | 1 |
| 6 | 10 | 0 |

From the result of FIG. 1, the following facts have been found.

(1) When the samples 1, 2 and 3 are compared, both real and imaginary parts of the complex relative permittivity increase when the adding amount of the electroconductive carbon black is increased and the ratio is bigger in the real part. Accordingly, when a small amount of the electroconductive carbon black is added, it comes nearer the side where (d/λ) on the non-reflective curve becomes smaller whereby a thinner absorber can be prepared. It has been known that, when the adding amount of the electroconductive carbon black is further increased, there is an increase of the ratio where the imaginary part increases.

(2) In the samples 5 and 6, the complex relative permittivity is on a non-reflective curve and that is a compounding having an ideal absorbing property. Especially in the sample 5, the ratio (d/λ) of thickness of the absorber to wavelength of the absorbed wavelength is about 0.09 whereby a thin absorber can be prepared.

(3) In each of the samples, the complex relative permittivity changes nearly in parallel to the non-reflective curve together with frequency and, therefore, it is possible to prepare an absorber corresponding to any frequency of 50–110 GHz by a mere change of thickness without changing the compounding.

Figure 2:
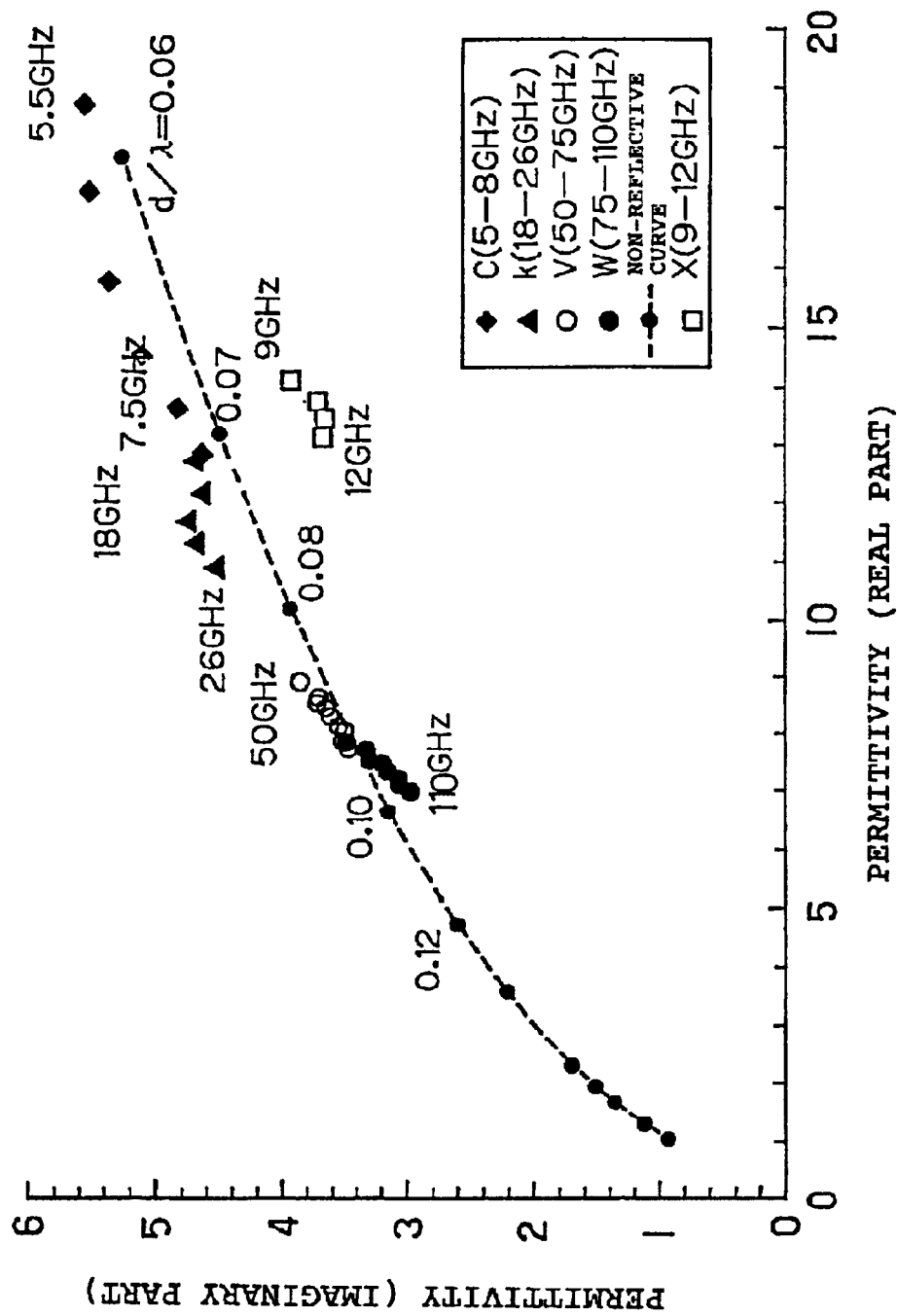
FIG. 2 is another graph showing the result of measurement of complex relative permittivity of a sample of an epoxy resin board in accordance with this invention.

From the above results, the sample 5 which is most suitable for the object of this invention was selected and a complex relative permittivity at 5–50 GHz was measured as same as above by expanding the frequency range to a microwave range and the result is shown in FIG. 2 together with the above-mentioned results.

As a result, it was confirmed that the complex relative permittivity of the sample 5 was almost close to the non-reflective curve even at the frequency range of 5–50 GHz and that the composition of the sample 5 efficiently absorbed the radio wave of microwave and millimetric wave ranges.

From the above, in a composition of the radio wave absorber, it is preferred that the compounding amount of the electroconductive titanium oxide to 100 parts by weight of the substrate is 5–40 parts by weight or, preferably, 10–35 parts by weight and that the compounding amount of the electroconductive carbon black to 100 parts by weight of the substrate is from more than 0 part by weight to not more than 4 parts by weight while the variation factors by the type of the substrate and also by the type of the electroconductive titanium oxide and the electroconductive carbon black are taken into consideration. Further, thickness of the radio wave absorber is determined by the relation between the complex relative permittivity and the wavelength of the radio wave to be absorbed.

Here, the electroconductive titanium oxide is effective for making the range of the absorbing property broad but, when its compounding amount to 100 parts by weight of the substrate is less than 5 parts by weight, both real and imaginary parts of the complex relative permittivity of the material become too low whereby the material is not able to cope with the radio wave of microwave range and millimetric wave range while, when the said amount is more than 40 parts by weight, both real and imaginary parts of the complex relative permittivity become too high whereby the material is not able to cope with those radio waves.

In addition, compounding of the electroconductive carbon black is preferred since it makes both real and imaginary parts of the complex relative permittivity high whereby thickness of the radio wave absorber can be made thin without affecting the radio wave absorbing property. However, when its compounding amount to 100 parts by weight of the substrate is more than 4 parts by weight, viscosity of the material becomes high whereby the processing ability becomes bad. In addition, an increasing rate of the imaginary part of the complex relative permittivity increases and, therefore, the complex relative permittivity takes a value apart from the non-reflective curve and the material does not cope with the radio wave.

When the coating material obtained hereinabove is applied on the metal part of shipping followed by setting or a film comprising the above-mentioned composition is placed on metal parts of the shipping, radio wave of microwave range or millimetric wave range can be efficiently absorbed.

On the other hand, there are many cases in some materials to be coated that weight of the radio wave absorber causes an obstacle whereby there are some cases where it is demanded to make the weight of the radio wave absorber light. In that case, a foamed substance is contained in the composition of the radio wave absorber.

When a foamed substance is contained, an air phase increases in the inner area of the radio wave absorber and the permittivity lowers. Therefore, it is necessary to consider in previously increasing the adding amount of the electroconductive titanium oxide to make the permittivity high.

With regard to the foamed substance, Microballoon is preferably used. The amount of Microballoon to 100 parts by weight of the substrate is from more than 0 part by weight to not more than 30 parts by weight or, preferably, not more than 20 parts by weight. When the amount is more than 30 parts by weight, permittivity of the material lowers whereby a desired radio wave absorbing property is not achieved.

EXAMPLES

Example 1

A mixture of epoxy resin and a setting agent was used as a substrate, then an electroconductive titanium oxide and an electroconductive carbon black were added in the amounts as shown in Table 2, then a solvent was added thereto and the mixture was mixed with stirring in a mill. Amount of the solvent to 80 parts by weight of the above composition was 20 parts by weight.

Figure 3:
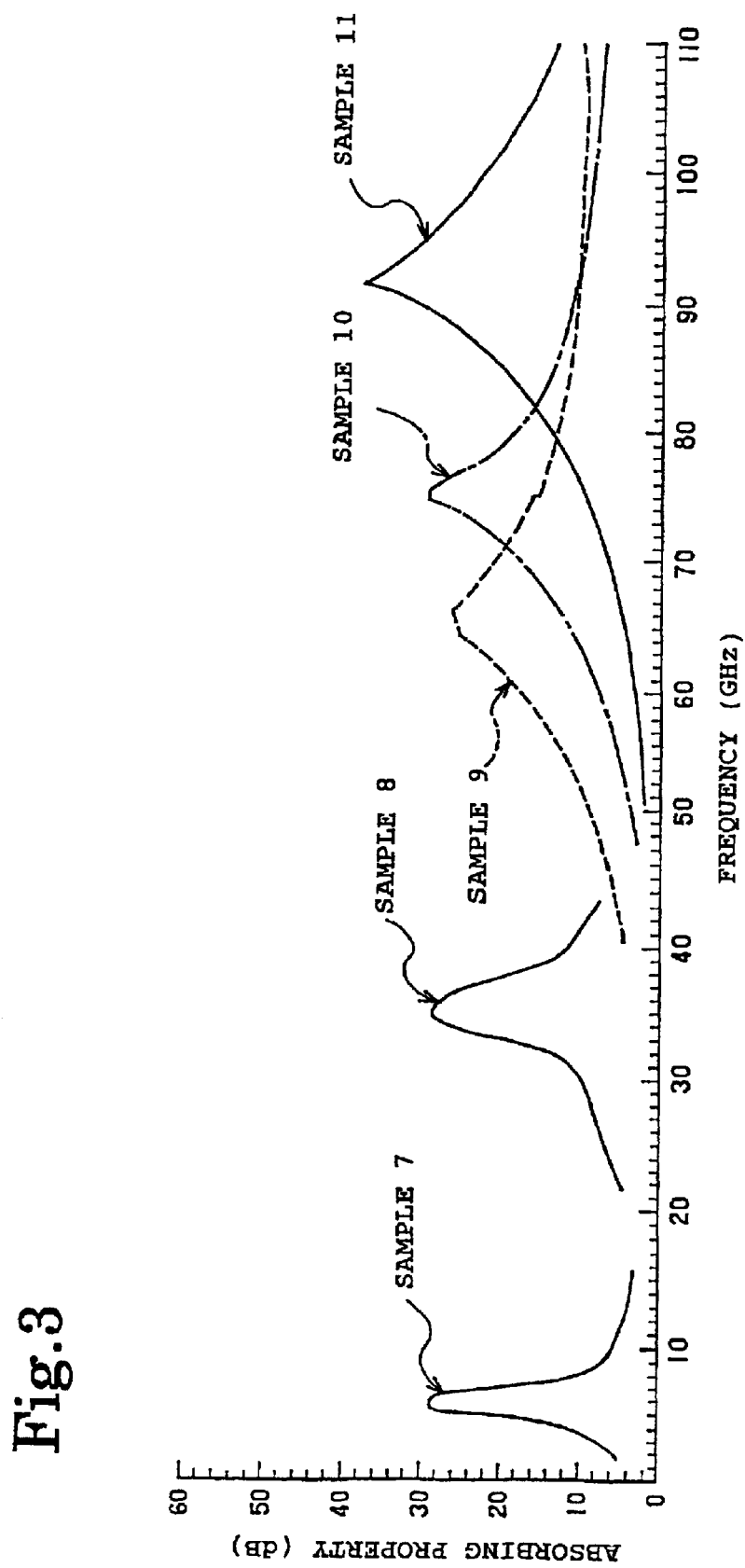
FIG. 3 is a graph showing the result of evaluation of radio absorbing property of a coating material according to an example of this invention.

This was applied by spraying on an aluminum board until the thickness after setting became 3.60 mm (sample 7), 0.75 mm (sample 8), 0.40 mm (sample 9), 0.35 mm (sample 10) and 0.31 mm (sample 11) whereupon five sheets of flat boards (samples 7–11) were prepared. After the coating material was set, radio wave of microwave range and millimetric wave range (frequency: 1–110 GHz) was subjected to incidence onto the applied surface of the flat board with an angle of incidence of 4° whereupon the absorbing property was evaluated. The result is shown in FIG. 3.

TABLE 2

|  | Parts by weight |
| --- | --- |
| Substrate (Epoxy Resin and Setting Agent) | 100 |
| Electroconductive Titanium Oxide (*1) | 32 |
| Electroconductive Carbon Black (*2) | 1 |

(*1) Electroconductive titanium oxide in needles FT 2000 (trade name manufactured by Ishihara Sangyo)
(*2) Ketjenblack (trade name manufactured by Nippon E.C.)

From FIG. 3, it was found that, in each of the samples, maximum value of the absorbing property was not less than 25 dB and, particularly in the samples 9, 10 and 11, the frequency range showing an absorbing property of not less than 20 dB which was a yardstick for an excellent absorbing property was confirmed within a broad range of frequency region and that the samples were good radio wave absorbers.

Example 2

A mixture of epoxy resin and a setting agent was used as a substrate, then an electroconductive titanium oxide, an electroconductive carbon black and Microballoon were added thereto in the amounts as shown in Table 3 followed by adding a solvent thereto and the mixture was mixed with stirring in a mill. Amount of the solvent to 80 parts by weight of the above composition was 20 parts by weight.

Figure 4:
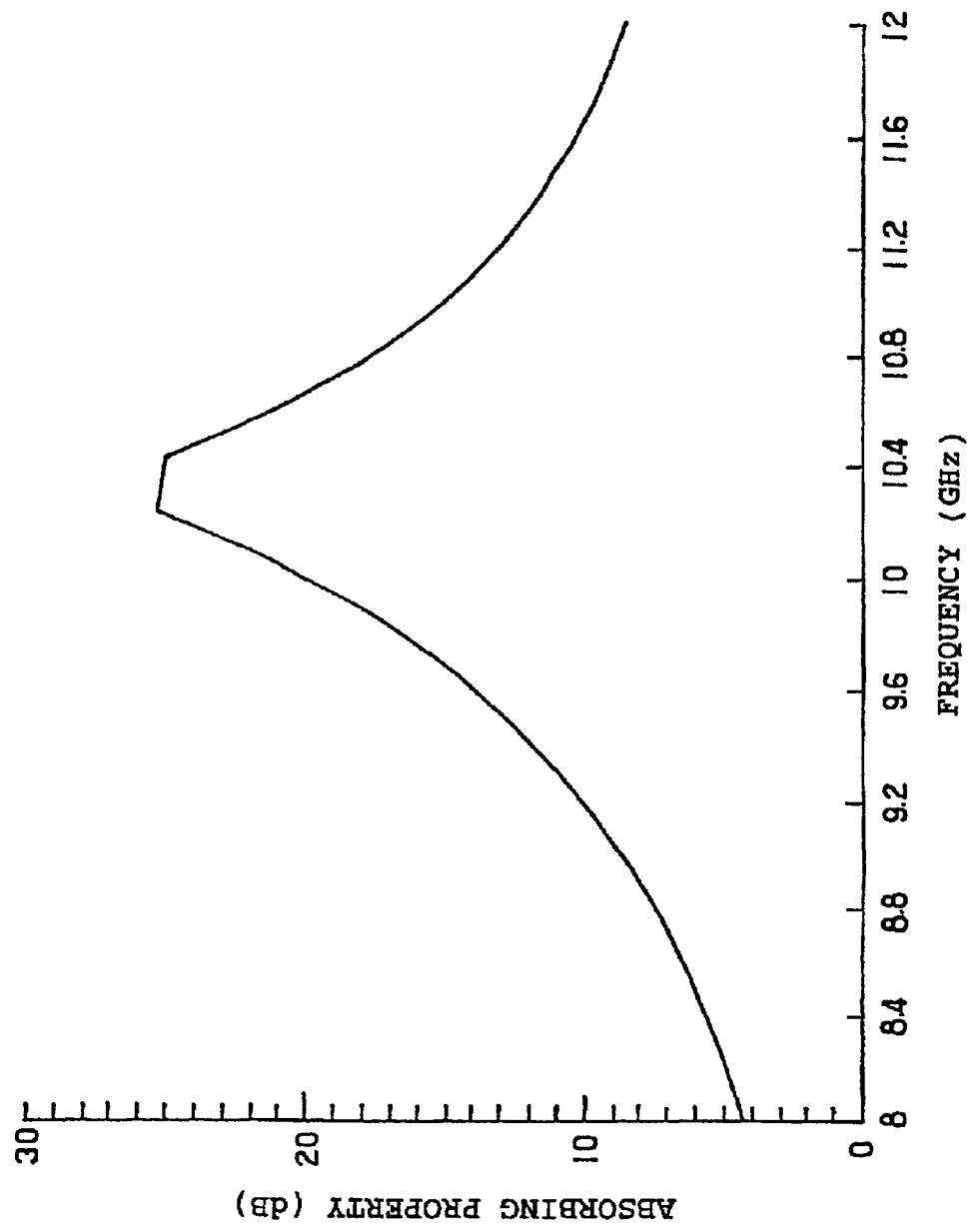
FIG. 4 is a graph showing the result of evaluation of radio absorbing property of a coating material according to another example of this invention.

This was applied by spraying on an aluminum board until the thickness after setting became 2.4 mm. After the coating material was set, radio wave of microwave range (8–12 GHz) was subjected to incidence onto the applied surface with an angle of incidence of 4° whereupon the absorbing property was evaluated. The result is shown in FIG. 4.

TABLE 3

|  | Parts by Weight |
| --- | --- |
| Substrate (Epoxy Resin and Setting Agent) | 100 |
| Electroconductive Titanium Oxide (*1) | 40 |
| Electroconductive Carbon Black (*2) | 1 |
| Microballoon (*3) | 14.3 |

(*1) Electroconductive titanium oxide in needles FT 2000 (trade name manufactured by Ishihara Sangyo)
(*2) Ketjenblack (trade name manufactured by Nippon E.C.)
(*3) Microballoon 80 GCA (trade name manufactured by Matsumoto Jushi)

From FIG. 4, it was found that maximum value of the absorbing property was not less than 25 dB and the frequency range showing an absorbing property of not less than 20 dB which was a yardstick for an excellent absorbing property was confirmed within a certain extent.

INDUSTRIAL APPLICABILITY

In this invention, a composition where an electroconductive titanium oxide is compounded with a substrate such as resin is used as a material for absorption of radio wave as mentioned above whereupon it is now possible that a radio wave absorber corresponding to any frequency of a microwave range and a millimetric wave range is prepared depending upon the changes in its thickness and it is also possible that radio wave of a broad range can be efficiently absorbed in spite of the radio wave absorber having a thin thickness.

In addition, when Microballoon is compounded with the above-mentioned substrate, it is possible to make the weight of the radio wave absorber light.

What is claimed is:

1. A composition for absorption of radio waves comprising:

a substrate;

an electroconductive titanium oxide compounded with the substrate; and an electroconductive carbon black, wherein a compounding ratio of said electroconductive titanium oxide to 100 parts by weight of the substrate is 5–40 parts by weight and the electroconductive carbon black is compounded in an amount from more than 0 parts by weight to not more than 4 parts by weight to 100 parts by weight of the substrate.

2. The composition for absorption of radio waves according to claim 1, wherein the said substrate is at least one substrate selected from a group consisting of a thermoplastic resin, a thermosetting resin, a rubber and an elastomer.

3. The composition for absorption of radio waves according to claim 1, wherein the said substrate is a thermosetting resin.

* * * * *